(12) United States Patent
Schober et al.

(10) Patent No.: US 10,367,514 B2
(45) Date of Patent: Jul. 30, 2019

(54) PASSIVE PHASED INJECTION LOCKED CIRCUIT

(71) Applicant: Circuit Seed, LLC, Newport Beach, CA (US)

(72) Inventors: Susan Marya Schober, Corona Del Mar, CA (US); Robert C. Schober, Huntington Beach, CA (US); Herbert Shapiro, Laguna Niguel, CA (US)

(73) Assignee: Circuit Seed, LLC, Newport Beach, CA (US)

( * ) Notice: Subject to any disclaimer, the term of this patent is extended or adjusted under 35 U.S.C. 154(b) by 0 days.

(21) Appl. No.: 15/545,893

(22) PCT Filed: May 22, 2015

(86) PCT No.: PCT/US2015/032303
§ 371 (c)(1),
(2) Date: Jul. 24, 2017

(87) PCT Pub. No.: WO2016/118183
PCT Pub. Date: Jul. 28, 2016

(65) Prior Publication Data
US 2018/0019757 A1 Jan. 18, 2018

Related U.S. Application Data

(60) Provisional application No. 62/107,409, filed on Jan. 24, 2015.

(51) Int. Cl.
*H03B 5/12* (2006.01)
*H03K 3/03* (2006.01)
(Continued)

(52) U.S. Cl.
CPC ............ *H03L 7/0995* (2013.01); *H03B 5/12* (2013.01); *H03K 3/0315* (2013.01);
(Continued)

(58) Field of Classification Search
CPC ............... H03B 5/1228; H03B 5/1265; H03B 2200/0016; H03B 9/14; H03B 5/12;
(Continued)

(56) References Cited

U.S. PATENT DOCUMENTS 5,349,311 A 9/1994 Mentzer
5,463,353 A 10/1995 Countryman et al.
(Continued)

OTHER PUBLICATIONS

PCT Search Report and Written Opinion dated Aug. 21, 2015 for PCT Application No. PCT/2015/32303, 7 pages.
(Continued)

*Primary Examiner* — Khanh C Tran
(74) *Attorney, Agent, or Firm* — Lee & Hayes, P.C.

(57) ABSTRACT

The present invention relates to passive phased injection locked circuit and ring-based voltage controlled oscillators. A passive phased injection locked circuit comprises first and second transmission lines, each has a plurality of discrete elements, that are operative to delay the phase of AC signal. Between the first and second transmission lines, a capacitor network is formed to advance the phases of the AC signal in concert along the transmission lines. For the ring-based voltage controlled oscillators, each of the first and second transmission lines has an odd number of discrete elements.

14 Claims, 7 Drawing Sheets

(51) Int. Cl.
*H03L 7/04* (2006.01)
*H03L 7/24* (2006.01)
*H03K 3/354* (2006.01)
*H03L 7/089* (2006.01)
*H03L 7/091* (2006.01)
*H03L 7/099* (2006.01)

(52) U.S. Cl.
CPC ............ *H03K 3/0322* (2013.01); *H03K 3/354* (2013.01); *H03L 7/04* (2013.01); *H03L 7/0891* (2013.01); *H03L 7/091* (2013.01); *H03L 7/24* (2013.01); *H03L 2207/06* (2013.01); *H03L 2207/10* (2013.01)

(58) Field of Classification Search
CPC ............ G06F 1/12; G06F 1/08; H03K 3/0315; H03K 5/15013; H03K 3/354; H03K 3/86; H03K 5/14; H03K 3/36; H03K 19/018557; H03K 3/0322; H03L 7/099; H03L 7/0891; H03L 7/091; H03L 7/24; H03L 7/00; H03L 7/0991; H03L 2207/06; H03L 7/04; H04L 25/0298; H04L 25/0278; H04L 7/0331; H04L 25/085
See application file for complete search history.

(56) References Cited

U.S. PATENT DOCUMENTS

| | | | |
|---|---|---|---|
| 6,057,673 A | 5/2000 | Okayama | |
| 6,104,253 A * | 8/2000 | Hall | H03K 3/0315 327/294 |
| 7,683,725 B2 * | 3/2010 | Kim | H03K 3/0315 331/177 R |
| 2003/0214361 A1 * | 11/2003 | Nishikido | H03K 3/0231 331/57 |
| 2004/0102170 A1 | 5/2004 | Jensen et al. | |
| 2009/0160487 A1 | 6/2009 | Hu et al. | |
| 2010/0253298 A1 * | 10/2010 | Nonis | H03K 3/0315 323/282 |
| 2011/0309888 A1 | 12/2011 | Bulzacchelli et al. | |
| 2013/0207725 A1 | 8/2013 | Afshari et al. | |
| 2014/0062550 A1 | 3/2014 | Lee et al. | |
| 2015/0030102 A1 * | 1/2015 | Hormis | H04L 1/243 375/296 |
| 2015/0180455 A1 * | 6/2015 | Beccue | H03B 5/18 331/57 |
| 2015/0213873 A1 | 7/2015 | Joo et al. | |
| 2017/0040941 A1 * | 2/2017 | Chatwin | H03K 3/0315 |

OTHER PUBLICATIONS

Office Action for U.S. Appl. No. 15/545,200, dated Oct. 1, 2018, Schober et al, "Phase Frequency Detector and Accurate Low Jitter High Frequency Wide-Band Phase Lock Loop", 6 pages.

PCT Search Report and Written Opinion dated May 13, 2016 for PCT Application No. PCT/US16/14639, 11 pages.

Final Office Action dated Mar. 6, 2019 for U.S. Appl. No. 15/545,200 "Phase Frequency Detector and Accurate Low Jitter High Frequency Wide-Band Phase Lock Loop" Schober, 8 pages.

* cited by examiner $s_1$        $s_N$

Each nodes has 2(m−1) connections to neighboring row(s) to ensure the phase

| s | r | Inv.Size | $C_{eq}$ [fF] | θ [°] | Phases (rxs) | $f_{MAX}$ [GHz] | Power [mW] | Area [mm²] | P. Noise[a] [dBc/Hz] |
|---|---|---|---|---|---|---|---|---|---|
| 1 | 2 | 4x | 5.0 | 180 | 2 | 75.6 | 0.55 | 0.0020 | -102.0 |
| 3 | 2 | 4x | 1.0 | 120 | 6 | 27.5 | 0.52 | 0.0015 | -115.3 |
| 3 | 3 | 4x | 2.5 | 40 | 9 | 25.4 | 0.69 | 0.0021 | -120.3 |
| 3 | 4 | 8x | 1.0 | 30 | 12 | 28.2 | 0.88 | 0.0024 | -124.5 |
| 5 | 2 | 4x | 2.5 | 36 | 10 | 13.3 | 0.95 | 0.0050 | -122.8 |
| 5 | 4 | 8x | 1.0 | 18 | 20 | 16.5 | 1.40 | 0.0065 | -121.2 |
| 7 | 2 | 4x | 2.5 | 25.7 | 14 | 10.1 | 1.34 | 0.0110 | -119.6 |
| 9 | 2 | 4x | 5.0 | 20 | 18 | 6.7 | 1.52 | 0.0150 | -114.9 |
| 1 | 2 | 4x | 5.0 | 180 | 2 | 75.6 | 0.55 | 0.0020 | -102.0 | a. Phase noise measurement uses $f_{MAX}$ and displays value at 10MHz offset.

Figure 6

| | This Work | [7] | [8] | [9] | [10] | [11] | [12] | [13] | [14] |
|---|---|---|---|---|---|---|---|---|---|
| CMOS Technology | 40nm | 130nm | 45nm SOI | 20nm | 65nm | 65nm | 130nm | 28nm FDSOI | 90nm |
| Implementation | Pass. IL-Ring | Ring VCO | Ring VCO | IL-Ring | Ring VCO | Ring VCO | Ring VCO | Ring VCO | LC-IL |
| Frequency Range [GHz] | 0.8-28.2 | 1.0-10.3 | 1.0-8.5 | 2.0-16.0 | 0.6-0.8 | 0.39-1.41 | 0.8-1.8 | 4.0-11.0 | 19.75-20.25 |
| Output Frequency [GHz] | 28.0 | 1.0-10.3 | 2.5 | 15.0 | 0.8 | 0.9 | 1.5 | 8.0 | 20.0 |
| Int. RMS Jitter [ps] | 0.77 | <3.0 | 0.99 | 0.268-0.434 | 21.5 | 1.7 | 0.4 | 0.558-0.642 | 0.085 |
| Phase Noise[b] [dBc/Hz] | -124.5 | N/A | -114.9 | -136.6 | -124.0[d] | -124.0[d] | -145.0[d] | -116.6[d] | -150.0 |
| Supply Voltage [V] | 0.5-1.2 (1.0) | 1.8 | 1.8/2.5 | 1.1/1.25 | 1.1-1.3 | 0.8 | 1.1 | 1.0 | 1.5 |
| VCO Power (VCO) [mW] | 0.65-1.25 (0.88) | 8.0 | 2.0[d] | 5.0[d] | 0.51 | 0.4[d] | 0.4[d] | 1.63[d] | 70.0[d] |
| VCO Area [mm²] | 0.0024 | 0.714 | 0.006[d] | 0.0025[d] | 0.027 | 0.003[d] | 0.01[d] | 0.0025[d] | 0.0325[d] |
| Figure of Merit[c] [dBc/Hz] | -194.0 | -- | -178.9 | -193.1 | -185.0 | -187.1 | -192.5 | -192.5 | -197.5 | b. Phase noise measurement uses fOUT and displays value at the 10MHz offset.
c. FOM = PN − 20 log (fOUT/fOFFSET) + 10log (P/1mW).
d. Estimated from paper.

Figure 7

PASSIVE PHASED INJECTION LOCKED CIRCUIT

CROSS-REFERENCE TO RELATED APPLICATIONS

The present application is a 35 U.S.C. § 371 National Stage Entry of, and claims priority to, International Application No. PCT/US2015/032303, filed May 22, 2015, entitled "PASSIVE PHASED INJECTION LOCKED CIRCUIT," which claims the benefit of priority to U.S. Provisional Application No. 62/107,409, entitled "PASSIVE PHASED INJECTION LOCKED CIRCUIT," filed on Jan. 24, 2015. The contents of each of the above applications are incorporated herein by reference in their entirety.

STATEMENT REGARDING FEDERALLY SPONSORED RESEARCH OR DEVELOPMENT

N/A

NAMES OF THE PARTIES TO A JOINT RESEARCH AGREEMENT

N/A

BACKGROUND OF THE INVENTION

Field of the Invention

The present invention relates to passive phased injection locked circuit and ring-based voltage controlled oscillators.

Description of Related Art

Ring oscillators (or ROs) based on digital logic building blocks are a popular choice for multi-protocol phase-locked loops (or PLLs) operating in the 0.5-12 GHz range due to their minimal area, wide-tuning range, low power consumption, scalability to and between sub-μm technologies, and general lack of required analog process extensions. Compared to tuned, high-Q (or quality factor) Inductor-capacitor resonant (or LC) oscillators which target specific higher frequencies at the expense of an increased power and area trade-off, ROs have inferior phase noise performance which restricts their use to only non-critical applications. Specifically, the "resonator" quality factor (or Q) of a ring oscillator is particularly low because the energy stored in every cycle at each output node capacitance is immediately discarded, then restored at the worst possible time at the resonator edges instead of at the ideal peak voltage as in an LC oscillator. In general, from a broad perspective, this lack of energy efficiency accounts for the well-known overall poor phase noise performance exhibited by state of the art ROs.

Other factors such as flicker (i.e. 1/f), shot, thermal, and white noise, which affect phase noise in both single-ended and differential ring oscillators, have been extensively studied over the last 20 years while integrated circuit implementation has been dedicated to applying these principles and developing circuitry to improve the performance of ROs in PLLs which operate in the multi-GHz range. The importance of doing so lies in the inherent non-feasibility of fabricating LC oscillators at smaller feature sizes due to large area and cost as well as the lack of necessary analog extensions being readily available for deep sub-μm CMOS processes.

Among the various practices utilized to lower the phase noise of a ring oscillator operating in a phase-locked loop, two techniques which have been proven successful at smaller feature sizes stand out: including, 1) using additional injection locking (or IL) circuitry and 2) exploiting creative, yet strict symmetry in the ring design and physical layout. For instance, in J. Chien et al., "A pulse-position-modulation phase-noise-reduction technique for a 2-to-16 GHz injection-locked ring oscillator in 20 nm CMOS," ISSCC Dig. Tech. Papers, pp. 52-53, February 2014, it uses precisely timed IL which yields extremely low phase noise results at frequencies up to 16 GHz; while, in M. Chen et al., "A calibration-free 800 MHz fractional-N digital PLL with embedded TDC," ISSCC Dig. Tech. Papers, pp. 472-473, February 2010, it presents a unique symmetrical differential RO which can loosely be classified as IL though the use of passive resistors. In W. Deng et al., "A 0.0066 mm2 780 μW fully synthesizable PLL with a current-output DAC and an interpolative phase-coupled oscillator using edge-injection technique," ISSCC Dig. Tech. Papers, pp. 266-267, February 2014, IL techniques are applied to an innovative, highly symmetric ring oscillator structure composed of 3 single-ended logic-based rings. In these examples, IL techniques require extra circuitry which may increase the power and/or area of an integrated circuit. Additionally, symmetry may require extra design time and area therefor.

BRIEF SUMMARY OF THE INVENTION

The present invention utilizes phase injection locking via a network of symmetrically placed passive metal interconnect coupling capacitors to reduce the phase noise of an inverter-based ring VCO. The result of the proposed RO design is a more energy efficient circuit which evenly distributes charge between the various nodes during oscillation. Furthermore, the fundamental basic building blocks of the proposed ring oscillator are discussed in order to provide a straightforward methodology for expanding the design to work for multiple phases and a variety of frequencies in the 0.5-to-75.6 GHz operating range. Using the aforementioned procedure, a variety of configurations of the VCO have been fabricated and tested in an all-digital 40 nm TSMC CMOS process. Also, a 0.8-to-28.2 GHz quadrature ring VCO was designed, fabricated, and physically tested with a PLL in the same process.

According to one aspect of the present invention, it provides a passive phased injected locked circuit.

According to another aspect of the present invention, it provides a voltage controlled oscillator, including first and second oscillators.

BRIEF DESCRIPTION OF THE SEVERAL VIEWS OF THE DRAWING

Embodiments of the present invention described are described by way of example with reference to the accompanying drawings.

FIG. 6 shows experimental results of the ring voltage control oscillator structures;

FIG. 7 shows comparison of ring voltage controlled oscillator based phase lock loop results in comparison with a state of the art examples;

DETAILED DESCRIPTION OF THE INVENTION

Figure 1A:
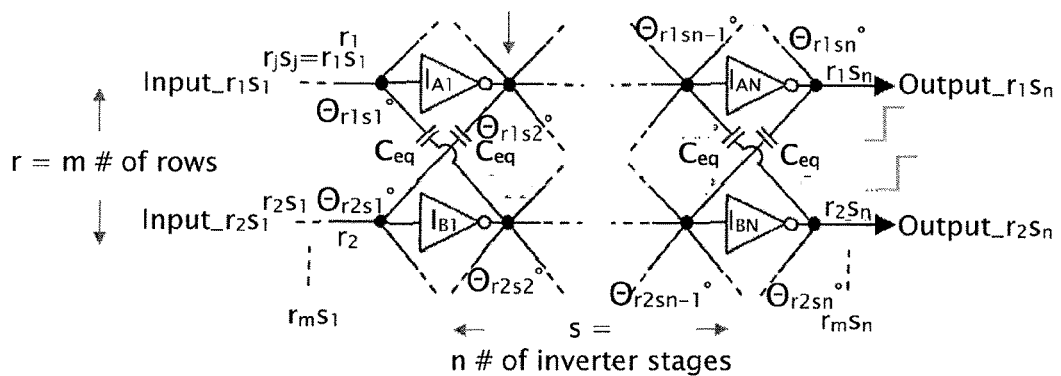
FIG. 1A is a block diagram of a capacitively phase-coupled circuit of a preferred embodiment of the present invention.
Figure 1B:
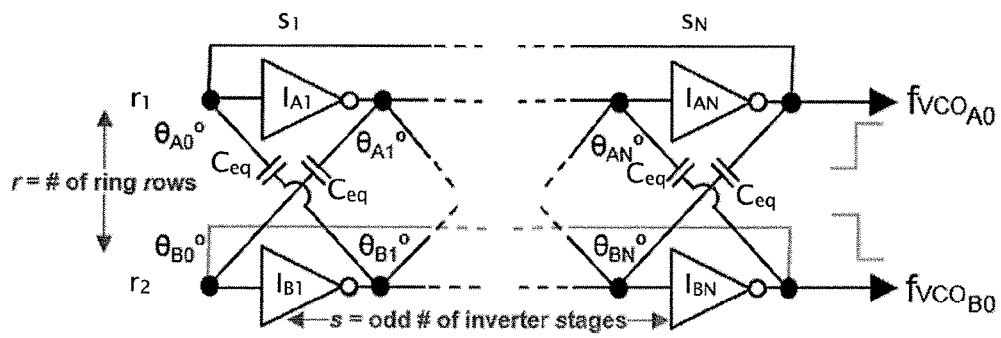
FIG. 1B is a block diagram of a capacitively phase-coupled ring voltage controlled oscillator of a preferred embodiment of the present invention.

FIG. 1B shows a block diagram of an inverter-based ring voltage controlled oscillator of the present invention, which uses phase injection locking via a network of symmetrically placed passive metal interconnect coupling capacitors $C_{eq}$ to reduce the phase noise thereof.

Two or more chains (or transmission lines) r1 and r2 of circuit elements provide progressive signal delays $\theta_{A1}$ and $\theta_{B1}$ along the chains (or transmission lines) when two out of phase AC signals are applied. When two chains are used they are 180 degrees out of phase, and the output of inverter A1 shepherds the input of inverter B1 to the same phase angle by virtue of AC coupling through its $C_{eq}$ capacitance link, thus directly AC connecting A1 output to B1 input. In return, at the same phase angle, inverter B1 output return shepherds inverter A1 input to the exactly opposite phase angle.

Note that, in phase lock, there is no current through these coupling capacitors except the current that is needed to correct for parasitics. Thus as a result, ideally there is no change in voltage across the capacitors through a cycle: while the output of one inverter is at its peak, the input of the other inverter is also at its peak, etc. Here the value and matching of these coupling capacitors $C_{eq}$ has insignificant effect in maintaining phase lock. No change in voltage means that there is no power being wasted, making the circuit ultra-high Q (Quality factor). In effect, the capacitor/inverter or inverting amplifier gain) masquerade as the dual of an inductor. A capacitor in the feedback becomes the dual of an inductor, which replaces radio frequency (RF) inductors with capacitors resulting in high Q. In addition, these "inductors" are evenly distributed. An additional insight is that the resistance loss of a capacitor is low, unlike that of an inductor.

This results in an extremely high degree of spectral purity sine wave, arguably exceeding the spectral purity of an inductor based circuit. That is to say that odd harmonics are almost non-existent, spawning a spectrally pure highly engineered design parameter in RE circuits. Using capacitors instead of inductors also evades inductive coupling unwanted external fields into these circuits.

As additional stages are added in FIG. 1B (inverters AN and BN), the $C_{eq}$ capacitor network couples the two chains of elements together at inter-element cross connection points shepherding the phase angles into place, to injection lock the individual chains together.

The capacitors couple the two (or more) signal chains (or transmission lines) together insuring that the phases of the chains advance in concert along the elements in the chains, thus tightly coupling the signals together to provide a precise phase relationship.

This also works for coupling multiple phase angles together in that additive super-position sums to control the phase displacement as is used in FIG. 4 below. Here there is a transfer capacitor current, but the stored charge is only moved around between directly connected capacitors and not dissipated through any transistor, maintaining a high distributed Q.

Because the phases of both signals are moving together along the capacitively coupled chains, the capacitors are not being externally re-charged or discharged as they couple the chains together. This leads to a phase lock circuit with wide ranging tunability, inductor-like quality and stability without using inductors.

Furthermore, opening the coupled loops of the rxs circuit, where r and s could be even or odd integers, will result in a discrete lumped transmission line circuit with inverting stages to ensure the propagation of signals through each row are phase locked together. This is shown in FIG. 1A.

The number of circuit elements is arbitrary and the limit becomes infinite as the case with a wire. In the minimum extreme, the Differential Gyrator example of FIG. 3, where the number of rows is r=2 and the number of stages is s=1, produces acceptable complementary phases with reasonable spectral purity and can run at frequencies approaching the cutoff frequencies of the inverting stages of FIGS. 3 A1 and B1 inverting stages.

In order to make a ring voltage controlled oscillator the number of stages must be an odd positive integer while the number of rings may be any positive integer. The result of the RO design shown in FIG. 1B is a more energy efficient circuit which evenly distributes charge between the various nodes during oscillation, when comparing it with LC oscillators. Furthermore, the fundamental basic building blocks of the ring oscillator of the present invention are subsequently considered in order to provide a straightforward methodology for expanding the design to work for multiple phases and a variety of frequencies in the 0.5-to-75.6 GHz operating range when implemented in an all-digital 40 nm TSMC CMOS process as a baseline for translating to other IC process nodes. Using the aforementioned procedure, a 0.8-to-28.2 GHz quadrature ring VCO was designed, fabricated, and physically tested with a PLL in an all-digital 40 nm TSMC CMOS process. The ring VCO could also be implemented in any CMOS or other semiconductor technology such as GaAs, GaN, or SiGe, to further increase the frequency range as desired.

The ring VCO circuit design disclosed herein is designed using an inverter-based ring oscillator structure r1 or r2 of FIG. 1B. One advantage of using this type of RO is its simplicity. More importantly, rings of this nature can be built using basic circuit elements readily available in any given IC process. In fact, multiple-staged inverter-based ring oscillators are used extensively on practically all silicon dies for process monitoring. However, traditional ROs suffer from two major disadvantages which have limited their usefulness in PLL designs: 1) poor jitter (noise) characteristics and 2) lack of spectral purity (distortion).

A design approach of the present invention is presented in FIG. 1B, which takes two or more identical inverter-based staged-ROs r1 and r2 and uses phase injection-locking via capacitive coupling Ceq to provide a VCO with improved phase noise performance and spectral purity properties than state of the art RO designs, making the proposed ring VCO design more comparable to those of LC-based ones. Additionally, the application of the proposed ring VCO offers many other desirable properties beyond low noise attributes including: ability to have precise quadrature with many additional phase outputs available, wide range tunability, inductor-like quality and stability without using inductors, full scalability to and between deep sub-μm IC process nodes, compact physical size with minimal sized inverters, and the ability to work at supply voltages at 1V and below, with extremely low power operation due to the capacitors not dumping their energy on a cycle by cycle basis as in a ring oscillator.

Figure 2:
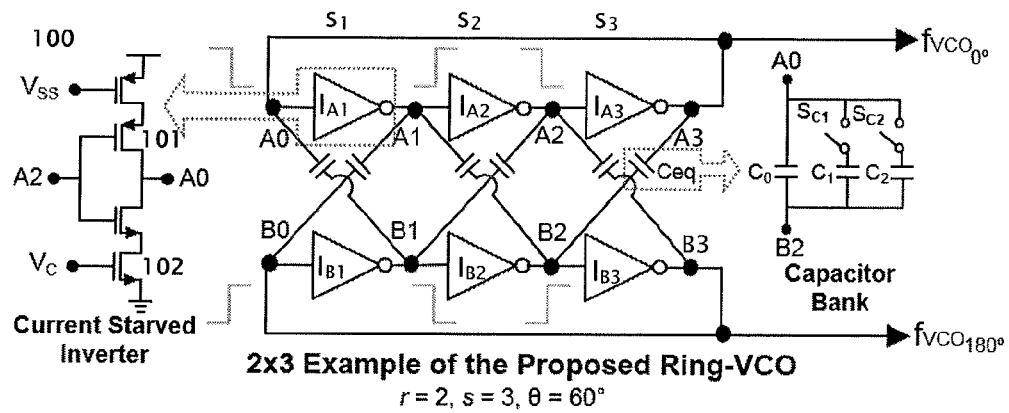
FIG. 2 is a block diagram of an expandable ring voltage controlled oscillator of another preferred embodiment of the current invention.

FIG. 2 shows a block diagram of another embodiment of the present invention, where the ring VCO includes: 1) current-starved inverters $I_{A1}$, $I_{A2}$, $I_{A3}$, $I_{B1}$, $I_{B2}$, and $I_{B3}$ or 100 for control voltage (or control signal), either $V_S$ or $V_C$, tuning, 2) two or more rings, $r_1$, $r_2$, made up of a number of odd current-starved inverter stages, $s_1$ ... $s_N$, and 3) relatively small interconnect symmetrically laid-out capacitors, Ceq or C0, to couple the phases of the neighboring input and output nodes of the rings, and optionally, 4) a logic-controlled bank of interconnect capacitors, C1, C2, for wider frequency range tuning using transmission gate switches $S_{C1}$, $S_{C2}$.

Figure 3:
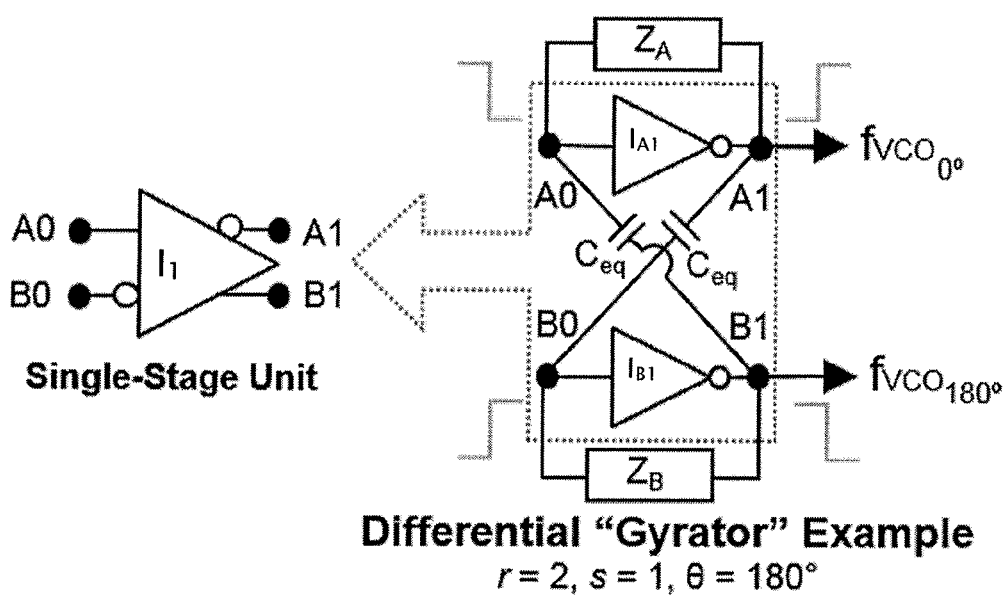
FIG. 3 is a block diagram of a single-stage unit for voltage controlled oscillator or gyrator.

The simplest unit form of the proposed ring VCO is the single-staged, double-ring differential oscillator as shown in FIG. 3. If the input is connected to the output of its respective ring with an appropriate impedance, $Z_A$, $Z_B$, the 2×1 ring will possess a behavior likened to that of a gyrator in that the capacitive circuit acts inductively due to its structure. This is due to a capacitor in the amplifier loop creating a "gyrator" that can masquerade as an inductor which functions as its "dual" circuit element. These capacitors phase-couple the input and output nodes of the stages together forming a distributed spiral virtual inductor as is shown in FIG. 3. FIG. 3 shows an example of a gyrator, which with row (or r) equal to 2, inverter stages (or s) equal to 1, which is not to be confused with a simple latch where r=1, s=2. In the latter case, the inverters act in series and do not oscillate due to oscillation conditions not being satisfied. The differential gyrator must be strictly cross-coupled in the layout of the circuit and additionally, $Z_A$ and $Z_B$ must be set appropriately to bias the inverting amplifiers in their active region. Additionally, the requirements for oscillation can be expedited via sufficient delay through the layout wire parasitics, which are readily found on any chip due to imperfect isolation and slight process variation, and therefore should be used to an advantage in this circuit. Although exploratory examples of this gyrator point to very high frequencies being obtainable up to 75.6 GHz in 40 nm CMOS, the circuit suffers from poorer phase noise performance as compared to multiple stages of s=3 and higher. This is due to the noise being correlated to a minimum number of nodes. Increasing the number of nodes to 3 or 5 significantly improves the performance of the proposed ring VCO. Silicon measurements showing this can be found in FIGS. 6 and 7.

The single-stage unit of FIG. 3 may be easily expanded to a more useful ring VCO which provides multiple phases. The output phases available for the r×s tuned ring VCO may be found at every θ.

$$\theta = \frac{360°}{\# \text{ of phases available}} = \frac{360°}{r*s}$$

where
s is an odd, positive integer representing the number of inverter stages in a single ring;
r is a positive integer greater than 1 representing the number of rows.

For the ring VCO in FIG. 2, there are s=3 ring inverter stages and r=2 rows connected by neighboring node capacitances. θ for this example is then calculated to be 60°; therefore, there are 6 output phases available at 0°, 60°, 120°, 180°, 240°, and 300° in this ring.

The conventional implementation uses current-starved inverters, but any inverter-type of implementation may be used. In this case, the frequency of a general r×s ring VCO is governed by the propagation delay of the s current-starved inverters in a single ring. The finely-tuned VCO output frequency, $f_{VCO}$, is controlled by means of $V_c$, by starving current through either the top (PMOS) 101 or bottom (NMOS) 102 transistors shown FIG. 2; in the present invention, the bottom NMOS transistors 102 were used as the inverters' current control. The inverters 101 and 102 symmetrically self-bias around their midpoint. Optionally, $f_{OUT}$ is also affected by the intentional loading by the tuning capacitor(s) and any switch and wiring path resistance at each node; for instance, increasing the capacitance and/or resistance lowers $f_{OUT}$.

The general output frequency of an r×s VCO may be found by the following equation:

$$f_{VCO} = \frac{1}{\tau_{total}} = \frac{1}{\tau_{ring} + \tau_{interconnect}}$$
$$= \frac{1}{(2s\tau_{pd}) + (2(r-1)R_{eq}C_{eq})}$$

where $T_{pd}$ is the propagation delay of a single inverter in the ring;
2(r−1) is the number of node connections to the neighboring row(s);
$C_{eq}$ is the parallel combination of the coupling capacitors $C_{0-2}$ that are in-use; and
$R_{eq}$ is the equivalent parallel resistance of the wired path and any switch resistance connected to the coupling capacitors in use.

Parasitic capacitances should be factored into this equation for accuracy. This basic r×s ring VCO structure is reconfigurable to allow for a variety of phases (e.g. by adjusting r and s) and frequencies (e.g. by varying the $V_C$ for fine tuning and $C_{eq}$ for course), an example of this will be presented in the next section for the quadrature configuration. Also, for the VCO to produce the desired phases, at least one stage in each row must be cross coupled to the other stage(s) in the other row(s).

Figure 4:
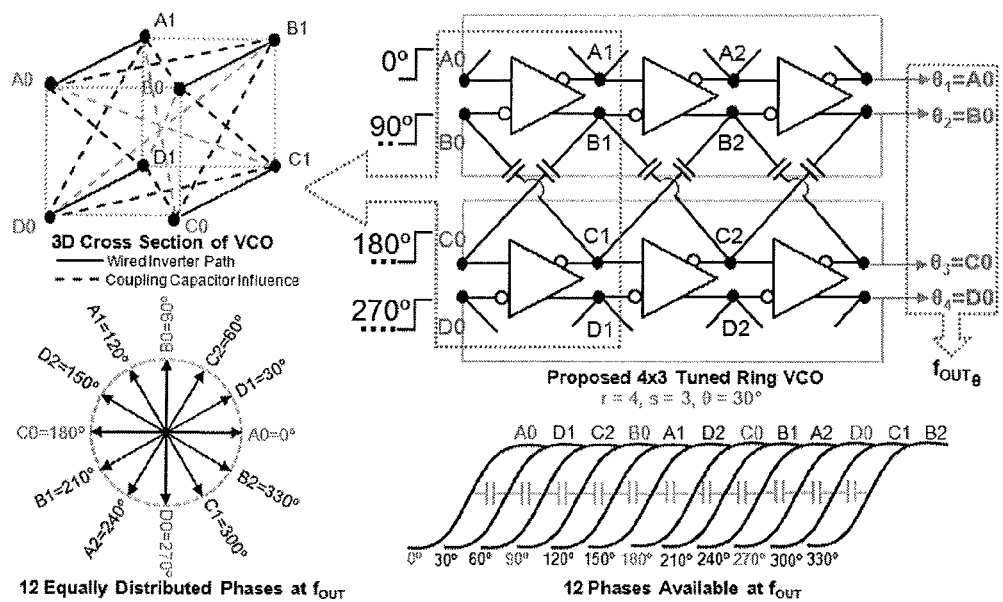
FIG. 4 is a 4×3 quadrature ring voltage controlled oscillator of yet another preferred embodiment of the present invention.

FIG. 4 shows a block diagram of a tuned ring 4×3 VCO, which further shows such expansion of the r×s ring oscillator. In this case, 4 of the 12 phases have been used to produce the quadrature outputs for the PLL.

The 3D cross section of VCO in the upper left of FIG. 4 provides an illustration of how charge is differentially cross-coupled within the ring through relatively small yet symmetrically laid-out, spirally-linked neighboring interconnect capacitances at every node. The charge coupling path creates a continuous, virtual inductor, adding to the resonance purity of the ring VCO though passive, balanced IL via capacitive charge coupling. A capacitor in a feedback path of the oscillator acts much like an inductor allowing the VCO to operate in a linear (i.e. sine-wave) to produce the quadrature outputs for the PLL.

Figure 5:
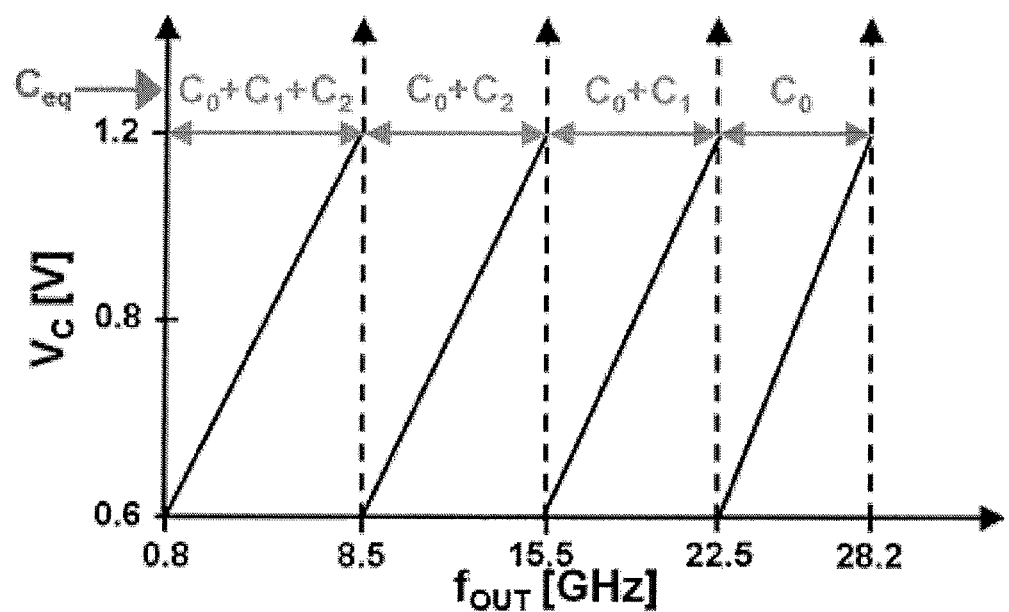
FIG. 5 shows a graph plot of $V_C$ versus VCO output frequency for the $C_{eq}$ turning bank.

The 3D cross section of VCO in the upper left of FIG. 4 further provides an illustration of how charge is differentially cross-coupled within the ring through relatively small yet symmetrically laid-out, spirally-linked neighboring interconnect capacitances at every node. The charge coupling path creates a continuous, virtual inductor, adding to the resonance purity of the ring VCO. A capacitor in a feedback path of the oscillator acts much like an inductor allowing the VCO to operate in a linear (i.e. high-quality sine-wave) mode, similar to an LC oscillator as opposed to a RO which operates in a switching mode. This provides low distortion which can be seen in the Experimental Results section including FIGS. 6 to 8. All of the inverters are operating in concert to produce a single sine wave cycle in precisely equal incremental phase steps. This distributed pseudo-inductor causes the energy lost during a cycle to be restored at the phase angle that adds minimal noise (i.e. jitter), which is the exact opposite of a conventional ring oscillator where energy is added at the most jitter sensitive phase angle. Lastly, the wide operating range of the proposed ring VCO is due to the digital logic-controlled bank composed of 3 symmetrically laid-out interconnect coupling capacitors, allowing for coarse tuning over 4 overlapping frequency ranges shown in FIG. 5.

Figure 8:
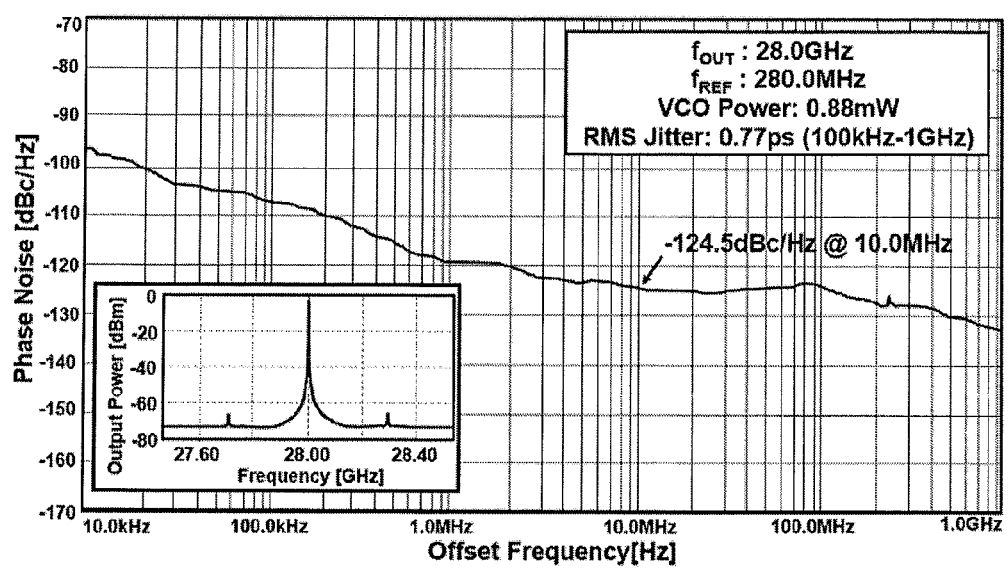
FIG. 8 shows an example of phase noise and output spectrum characteristics of the quadrature ring voltage controlled oscillator shown in FIG. 4.
Figure 9:
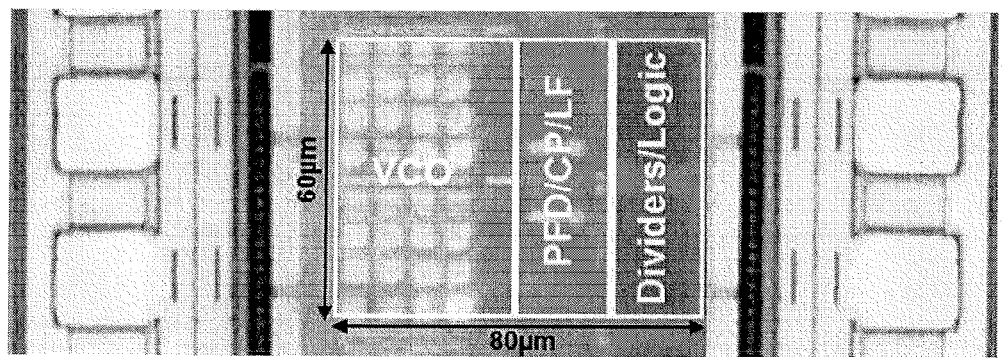
FIG. 9 shows a an example of a die micrograph of the quadrature ring voltage controlled oscillator in a phase lock loop (or PLL)

FIG. 6 shows overviews of the silicon measurements of a variety of expansions of the ring VCO structure and the proposed quadrature ring VCO implemented inside a charge pump PLL, all of which were fabricated in a 40 nm all-digital CMOS process and tested. A micrograph of the proposed 4×3 quadrature VCO in the PLL is shown in FIG. 9 and the phase noise and output spectrum are shown in FIG. 8. FIG. 7 compares the proposed 4×3 ring VCO results to state of the art examples.

This work has introduced an expandable structure for a tunable wide-operating range capacitively phase-coupled low noise, low power ring-based VCO for use in multi-GHz PLLs. Using this technique, a quadrature ring-based VCO was implemented in an all-digital 40 nm TSMC CMOS process. Most notably, the proposed 4×3 ring VCO occupies an area of 0.0024 mm$^2$, consumes a power of 0.88 mW at a 1.0V supply voltage, and possesses a phase noise of −124.5 dBc/Hz at the 10 MHz offset for a carrier frequency of 28.0 GHz. Furthermore, this work has the widest reported operating frequency range of any published VCO from 0.8-to-28.2 GHz. The VCO FOM is also the best reported for ring-based VCOs and is comparable to that of LC oscillators due to the passively-phase coupled IL symmetric ring topology and inherent low power operation.

The invention claimed is:

1. A passive phased injection locked circuit comprising:
   first and second transmission lines, said first transmission line comprises a plurality of current-starved inverters, and said second transmission line comprises a corresponding number of current-starved inverters to said first transmission line;
   each of said first and second transmission lines comprising
   1) an input and an output; and
   2) said current-starved inverters connected electrically in series between said input and said output, each of said current-starved inverters being operative to delay said phase of AC signal applied to said input;
   wherein an output of one of said current-starved inverters in said first or second transmission line is capacitively coupled to said input of said next higher corresponding one of said current-starved inverters in said other transmission line to form a network between said first and second transmission lines, said network being operative to advance said phases of said applied AC signal in concert along said transmission line.

2. A circuit as in claim 1 wherein said each of said first and second transmission lines comprise an odd number of said current-starved inverters.

3. A circuit as in claim 1 wherein said each of said current-starved inverter stages comprises:
   a. a first PMOS transistor,
   b. a second PMOS transistor,
   c. a first NMOS transistor, and
   d. a second NMOS transistor,
   wherein said first and second PMOS transistors and said first and second NMOS transistors are arranged to be symmetrically self-biased around midpoint.

4. A circuit as in claim 3 wherein said each of said first and second PMOS transistors and said first and second NMOS transistors comprises:
   a gate, a source, and a drain;
   wherein said drain of said first PMOS is in communication with said source of said second PMOS; said drain of said first PMOS is in communication with said source of said second PMOS; said drain of said second PMOS is in communication with said drain of said first NMOS to form said output of said each of said current-starved inverters; and said source of said first NMOS is in communication with said drain of said second NMOS; and
   said gate of said second PMOS and said gate of said first NMOS are connected together to receive said output of said next lower corresponding one of said current-starved inverters in said other transmission line.

5. A circuit as in claim 4 wherein said gate of said first PMOS or said gate of said second NMOS as said input of said each of said current-starved inverters to control frequency and phase of said output of said each of said current-starved inverters.

6. A circuit as in claim 1 further comprises a plurality of capacitors, each of said plurality of capacitors connects said output of one of said elements current-starved inverters in said first or second transmission line with said input of said next higher corresponding one of said elements current-starved inverters in said other transmission line.

7. A voltage controlled oscillator comprising first and second ring oscillators, said first ring oscillators comprising one or more odd number of current-starved inverter stages, and second ring oscillators comprising a corresponding number of current-starved inverter stages to said first oscillators, said current-starved inverter stages of each of said first and second ring oscillators being connected electrically in series between an input and an output of said each of said first and second ring oscillators, said output of each of said first and second ring oscillators being electrically connected to said input thereof, said input of each of said current-starved inverter stages of one of said first or second ring oscillators having a connection to said output of said corresponding one of said current-starved inverter stages of said other one of first and second ring oscillators, said connection comprising a capacitor for forming a capacitor network between said first and second ring oscillators operative to tune said first and second ring oscillators responsive to a first signal applied to said input of said first ring oscillators or second signal applied to said input of said second ring oscillators.

8. A voltage controlled oscillator as in claim 7 wherein said each of said current-starved inverter stages comprises:

a. a first PMOS transistor, b. a second PMOS transistor, c. a first NMOS transistor, and d. a second NMOS transistor, wherein said first and second PMOS transistors and said first and second NMOS transistors are arranged to be symmetrically self-biased around midpoint.

9. A voltage controlled oscillator as in claim 8 wherein said each of said first and second PMOS transistors and said first and second NMOS transistors comprises:

a gate, a source and a drain;

wherein said drain of said first PMOS is in communication with said source of said second PMOS; said drain of said first PMOS is in communication with said source of said second PMOS; said drain of said second PMOS is in communication with said drain of said first NMOS to form said output of said each of said current-starved inverter stages; and said source of said first NMOS is in communication with said drain of said second NMOS; and said gate of said second PMOS and said gate of said first NMOS are connected together to receive said output of said next lower corresponding one of said current-starved inverters in another one of said first ring oscillator or said second ring oscillator.

10. A voltage controlled oscillator as in claim 9 wherein said gate of said first PMOS or said gate of said second NMOS as said input of said each of said current-starved inverters to control frequency and phase of said output of said each of said current-starved inverters.

11. A tuned multiple-row voltage controlled oscillator, comprising:

a plurality of ring oscillators, each of said plurality of said ring oscillators comprising one or more odd number of current-starved inverter stages and all of said plurality of said ring oscillators have said same number of said current-starved inverter stages, said current-starved inverter stages of each of said plurality of said ring oscillators being connected electrically in series between an input and an output of said each of said plurality of said ring oscillators, said output of each of said plurality of said ring oscillators being electrically connected to said input thereof, said input of each of said current-starved inverter stages of one of said plurality of said ring oscillators having a connection to said output of said corresponding adjacent one of said current-starved inverter stages of said other one of said plurality of said ring oscillators, said connection comprising a capacitor for forming a capacitor network between said one and said adjacent one of said plurality of said ring oscillators operative to tune said plurality of said ring oscillators responsive to a plurality of signals applied to said inputs of said plurality of said ring oscillators.

12. A tuned multiple-row voltage controlled oscillator as in claim 11, wherein said each of said current-starved inverter stages comprises:

a. a first PMOS transistor, b. a second PMOS transistor, c. a first NMOS transistor, and d. a second NMOS transistor wherein said first and second PMOS transistors and said first and second NMOS transistors are arranged to be symmetrically self-biased around midpoint.

13. A tuned multiple-row voltage controlled oscillator as in claim 12, wherein said each of said first and second PMOS transistors and said first and second NMOS transistors comprises:

a gate, a source and a drain;

wherein said drain of said first PMOS is in communication with said source of said second PMOS; said drain of said first PMOS is in communication with said source of said second PMOS; said drain of said second PMOS is in communication with said drain of said first NMOS to form said output of said each of said current-starved inverter stages; and said source of said first NMOS is in communication with said drain of said second NMOS; and said gate of said second PMOS and said gate of said first NMOS are connected together to receive said output of said next lower corresponding one of said current-starved inverters in another one of said one or said adjacent one of said plurality of said ring oscillators.

14. A tuned multiple-row voltage controlled oscillator as in claim 13, wherein said gate of said first PMOS or said gate of said second NMOS as said input of said each of said current-starved inverters to control frequency and phase of said output of said each of said current-starved inverters.

\* \* \* \* \*